United States Patent
Barbara et al.

(10) Patent No.: US 9,379,052 B2
(45) Date of Patent: Jun. 28, 2016

(54) MULTI CHIP MODULES FOR DOWNHOLE EQUIPMENT

(71) Applicant: Schlumberger Technology Corporation, Sugar Land, TX (US)

(72) Inventors: Francois Barbara, Sartrouville (FR); Lahcen Garando, Orsay (FR)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 437 days.

(21) Appl. No.: 13/666,868

(22) Filed: Nov. 1, 2012

(65) Prior Publication Data

US 2013/0105140 A1    May 2, 2013

(30) Foreign Application Priority Data

Nov. 2, 2011    (EP) ..................................... 11290509

(51) Int. Cl.
| | |
|---|---|
| *E21B 4/04* | (2006.01) |
| *H01L 23/498* | (2006.01) |
| *H01L 23/15* | (2006.01) |
| *H01L 23/00* | (2006.01) |

(52) U.S. Cl.
CPC ............... *H01L 23/498* (2013.01); *E21B 4/04* (2013.01); *H01L 23/15* (2013.01); *H01L 24/45* (2013.01); *H01L 2224/45124* (2013.01); *H01L 2224/48227* (2013.01); *H01L 2224/48744* (2013.01); *H01L 2224/85444* (2013.01); *H01L 2924/01327* (2013.01)

(58) Field of Classification Search
CPC ................... H01L 23/498; H01L 2924/01327; H01L 2924/00; H01L 2924/00014; H01L 23/15; H01L 24/45; H01L 2224/85444; H01L 2224/45124; H01L 2224/48227; E21B 4/04

See application file for complete search history.

(56) References Cited

U.S. PATENT DOCUMENTS

| | | | |
|---|---|---|---|
| 2006/0060964 A1 | 3/2006 | Golla et al. | |
| 2010/0302748 A1* | 12/2010 | Taniguchi | ............... H01L 23/15 361/772 |

FOREIGN PATENT DOCUMENTS

| | | | | |
|---|---|---|---|---|
| EP | 2073261 A1 | 6/2009 | | |
| JP | 62131526 A | * | 6/1987 | .............. H01L 21/58 |

OTHER PUBLICATIONS

Extended European Search Report issued in related EP Application No. 11290509.6 mailed Jan. 19, 2012, 6 pages.

* cited by examiner

*Primary Examiner* — Yong-Suk (Philip) Ro

(57) ABSTRACT

An electronic assembly for use in a downhole module may include a multilayer ceramic assembly and an electronic component disposed on the multilayer ceramic assembly. The multilayer ceramic assembly includes a ceramic substrate, a nickel plating layer disposed on the ceramic substrate and a gold plating layer having a thickness of less than about 0.5 microns disposed on the nickel plating layer. A wirebond such as an aluminum wirebond extends between the electronic component and the gold plating layer.

15 Claims, 2 Drawing Sheets

MULTI CHIP MODULES FOR DOWNHOLE EQUIPMENT

BACKGROUND

The petroleum well is a hostile environment, as high pressure and temperature, fluid composition and movement together render measurement while drilling (MWD) and/or logging while drilling (LWD) operations challenging. The equipment used for MWD and LWD operations include various electronics that may be subjected to temperatures above about 125 degrees Celsius. Because the lifespan and reliability of printed circuit boards at these temperatures can be adversely affected, ceramic-substrate technologies have been developed using substrates such as thick film ceramics, high temperature co-fired substrates and low temperature co-fired substrates.

In many electrical components using ceramic substrates, aluminum wirebond connections are used to interconnect bare dies with a substrate having a thick (greater than about 1 micron) plating layer. In some cases, the plating layer may be a gold layer. In these cases, the interconnection between the gold layer and the aluminum wirebond may have limited reliability at high temperature above about 125 degrees Celsius. Poor reliability can result from formation of intermetallic compounds such as $Au_5Al_2$ (sometimes known as white plague) and $AuAl_2$ (sometimes known as purple plague) that can form between the gold layer and the aluminum wirebond. These compounds can increase electrical resistance and weaken the connection between the aluminum wirebond and the gold layer.

SUMMARY

The life expectancy and reliability of an interconnection between a wirebond such as an aluminum wirebond and a ceramic substrate having a plating layer such as a gold plating layer may be improved by limiting the thickness of the gold layer, optionally in conjunction with increasing the thickness of a nickel layer underneath the gold layer.

Accordingly, an embodiment of the disclosure may be found in an electronic assembly for use in a downhole module, the electronic assembly having a multilayer ceramic assembly and an electronic component disposed on the multilayer ceramic assembly. The multilayer ceramic assembly includes a ceramic substrate, a first plating layer disposed on the ceramic substrate and a second plating layer having a thickness of less than 0.5 microns disposed on the first plating layer. The electronic assembly includes a wirebond extending between the electronic component and the second plating layer.

Another embodiment of the disclosure may be found in an electronic assembly for use in a downhole module, the electronic assembly having a multilayer ceramic assembly and an electronic component disposed on the multilayer ceramic assembly. The multilayer ceramic assembly includes a ceramic substrate having a first surface and a second surface, a first nickel plating layer disposed on the first surface of the ceramic substrate, a second nickel plating layer disposed on the second surface of the ceramic substrate, a first gold plating layer having a thickness of less than about 0.5 microns disposed on the first nickel plating layer and a second gold plating layer having a thickness of less than about 0.5 microns disposed on the second nickel plating layer. The electronic assembly includes a wirebond extending between the electronic component and either the first gold plating layer or the second gold plating layer.

Another embodiment of the disclosure may be found in a method of manufacturing an electronic assembly for use in a downhole module. A multilayer ceramic assembly is provided that has a ceramic substrate, a nickel plating layer disposed on the ceramic substrate and a gold plating layer having a thickness of less than 0.5 microns disposed on the nickel plating layer. An electronic component is disposed on the multilayer ceramic substrate and a wirebond is extended between the electronic component and the gold plating layer.

While multiple embodiments with multiple elements are disclosed, still other embodiments and elements will become apparent to those skilled in the art from the following detailed description, which shows and describes illustrative embodiments. Accordingly, the drawings and detailed description are to be regarded as illustrative in nature and not restrictive.

DETAILED DESCRIPTION

One or more specific embodiments of the present disclosure will be described below including method, apparatus and system embodiments. These described embodiments and their various elements are only examples of the presently disclosed techniques. It should be appreciated that in the development of any such actual implementation, as in any engineering or design project, numerous implementation-specific decisions can be made to achieve the developers' specific goals, such as compliance with system-related and business-related constraints, which can vary from one implementation to another. Moreover, it should be appreciated that such a development effort might be time consuming, but would nevertheless be a routine undertaking of design, fabrication, and manufacture for those of ordinary skill having the benefit(s) of this disclosure.

When introducing elements of various embodiments of the present disclosure, the articles "a," "an," and "the" are intended to mean that there are one or more of the elements. The terms "comprising," "including," and "having" are intended to be inclusive and mean that there can be additional elements other than the listed elements. Additionally, it should be understood that references to "one embodiment" or "an embodiment" of the present disclosure are not intended to be interpreted as excluding the existence of additional embodiments that also incorporate the listed elements.

Figure 1:
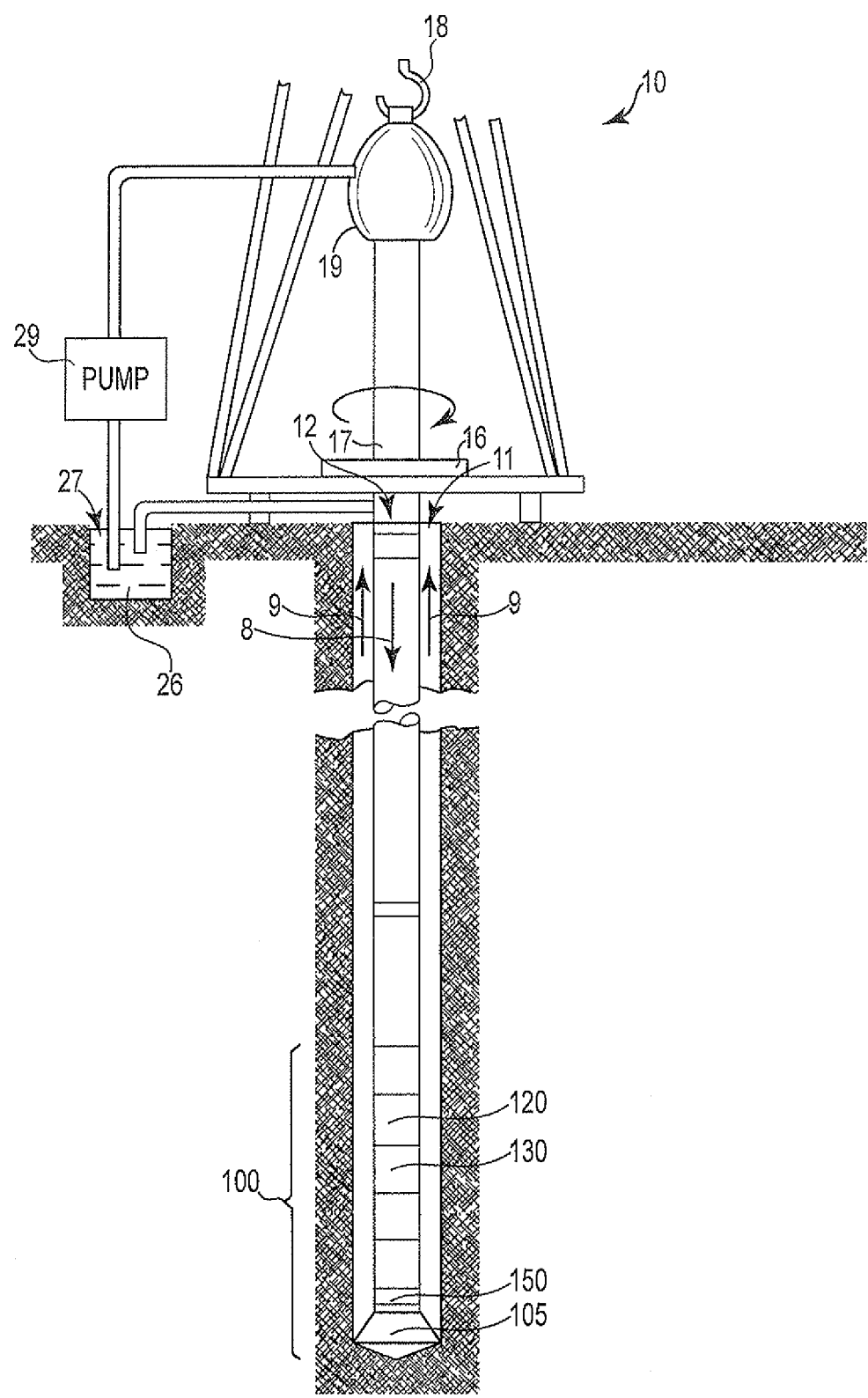
FIG. 1 is a schematic diagram of a wellsite system in accordance with an embodiment of the disclosure.

FIG. 1 illustrates an embodiment of a wellsite apparatus, system and methodology. The wellsite system of FIG. 1 can be onshore or offshore for, for example, exploring and producing oil, natural gas, and other resources that can be used, refined, and otherwise processed for fuel, raw materials and other purposes. In the wellsite system of FIG. 1, a borehole 11 can be formed in subsurface formations, such as rock formations, by rotary drilling using any suitable technique. A drillstring 12 can be suspended within the borehole 11 and can have a bottom hole assembly 100 that includes a drill bit 105 at its lower end. A surface system of the wellsite system of FIG. 1 can include a platform and derrick assembly 10 positioned over the borehole 11, the platform and derrick assembly 10 including a rotary table 16, kelly 17, hook 18 and rotary swivel 19. The drillstring 12 can be rotated by the rotary table 16, energized by any suitable means, which engages the kelly 17 at the upper end of the drillstring 12. The drillstring 12 can be suspended from the hook 18, attached to a traveling block (not shown), through the kelly 17 and the rotary swivel 19, which permits rotation of the drillstring 12 relative to the hook 18. A topdrive system could alternatively be used, which can be a topdrive system well known to those of ordinary skill in the art.

In the wellsite system of FIG. 1, the surface system can also include drilling fluid or mud 26 stored in a pit 27 formed at the well site. A pump 29 can deliver the drilling fluid 26 to the interior of the drillstring 12 via a port in the swivel 19, causing the drilling fluid to flow downwardly through the drillstring 12 as indicated by the directional arrow 8. The drilling fluid 26 can exit the drillstring 12 via ports in the drill bit 105, and circulate upwardly through the annulus region between the outside of the drillstring. 12 and the wall of the borehole 11, as indicated by the directional arrows 9. In this manner, the drilling fluid 26 lubricates the drill bit 105 and carries formation cuttings up to the surface, as the fluid 26 is returned to the pit 27 for recirculation.

The bottom hole assembly 100 of the wellsite system of FIG. 1 can, as one example, include one or more of a logging-while-drilling (LWD) module 120, a measuring-while-drilling (MWD) module 130, a roto-steerable system and motor 150, and the drill bit 105. As will be discussed with respect to subsequent Figures, it will be appreciated that downhole equipment such as a MWD/LWD module can include a variety of heat producing components (e.g. multi chip modules) that may be subjected to high temperatures above about 125 degrees Celsius at which point certain intermetallic compounds can form at the interfaces between dissimilar metallic components. Intermetallic compounds may increase electrical resistance and may weaken the mechanical bonding of such interfaces.

Figure 2:
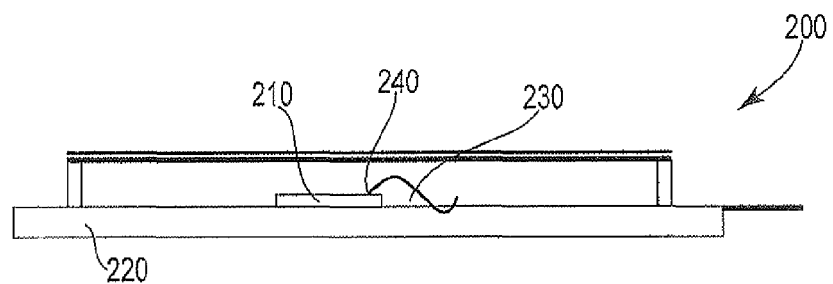
FIG. 2 is a schematic illustration of a wirebond assembly in accordance with an embodiment of the disclosure.

In some embodiments, downhole equipment such as a LWD module 120 (FIG. 1) or a MWD module 130 (FIG. 1) can include electrical components that are wirebonded onto a substrate. FIG. 2 is a schematic illustration of an electronic assembly 200 that includes an active die 210 that is secured to a ceramic substrate 220. A wirebond 230 extends from an electronic component 240 on the active die 210 to the ceramic substrate 220. The electronic component 240 may include one or more of integrated circuits, transistors, resistors, capacitors and the like. In some embodiments, the wirebond 230 may be formed of electrically conductive materials such as gold, silver, copper and others. In some embodiments, the wirebond 230 may be an aluminum wire.

In some embodiments, the ceramic substrate 220 may be a multilayer ceramic assembly. In some embodiments, the ceramic substrate 220 may be an $Al_2O_3$ ceramic, a HTCC (High Temperature Co-Fired Ceramic) or a LTCC (Low Temperature Co-Fired Ceramic). In some embodiments, multilayer ceramic assemblies may be multilayer co-fired ceramics such as HTCCs or LTCCs that can be formed, e.g., by first punching out cavities and vias in the unfired or green ceramic tape layers, metal paste used to fill the cavities and vias and print circuit traces on the tape surface, followed by the green tape layers being stacked together, laminated and fired in a furnace.

Many HTCC and LTCC materials can include a final metal plated layer to protect against corrosion and to facilitate attachment of electrical components. In some cases, a metal backing layer may be used underneath the final metal plated layer to provide a mechanical backing for the final metal plated layer. A variety of different metals may be used for the metal backing layer and for the final metal plated layer. In some embodiments, the metal backing layer may be a nickel layer. In some embodiments, the final metal plated layer may be a gold layer. In some cases, the nickel layer provides a mechanical backing for the gold layer and thereby improves the wear resistance of the gold layer.

Figure 3:
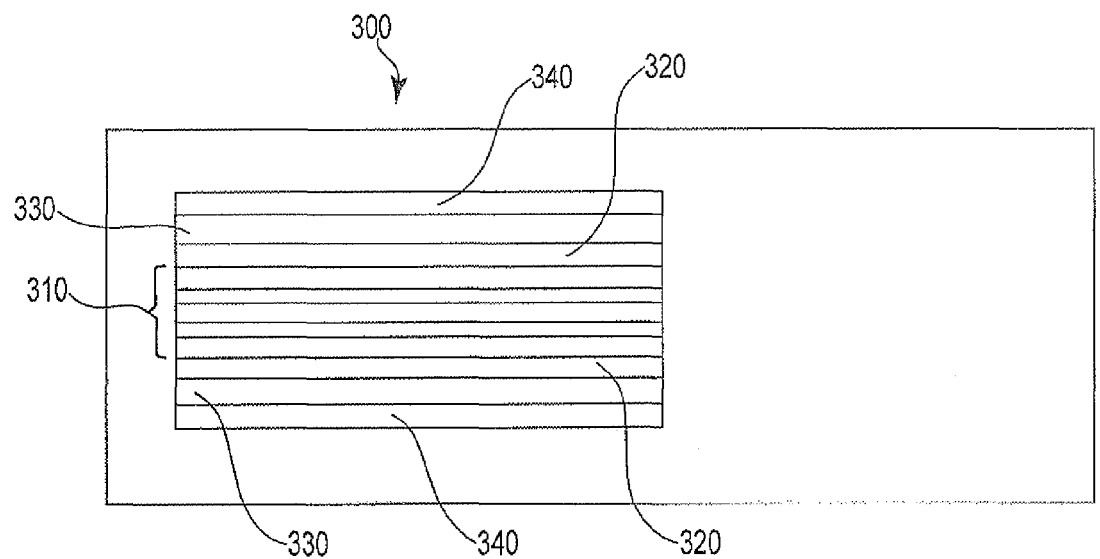
FIG. 3 is a schematic illustration of an electronic assembly in accordance with an embodiment of the disclosure.

FIG. 3 is a schematic illustration of a multilayer ceramic assembly 300 in accordance with an embodiment of the disclosure. The multilayer ceramic assembly 300 is illustrative of a ceramic substrate that could be used as the ceramic substrate 220 (FIG. 2). It will be appreciated that the particular number and arrangement of layers shown in FIG. 3 is merely illustrative, as multilayer ceramic assembly 300 may include any number and arrangement of layers, depending on circuitry needs. The multilayer ceramic assembly 300 includes a multilayer ceramic structure 310.

One or more conductive layers 320 are disposed on the multilayer ceramic structure 310. While two conductive layers 320 are illustrated, it will be appreciated that the multiple ceramic assembly 300 may include only one conductive layer 320, or may include three or more conductive layers 320. In some embodiments, the conductive layer(s) 320 may include conductive materials such as tungsten, copper, silver, and other metals.

In some embodiments, one or more nickel layers 330 may be disposed over the conductive layer(s) 320 and one or more gold layers 340 may be disposed over the nickel layer(s) 330. In some embodiments, the nickel layer(s) 330 may help to protect the multilayer ceramic structure 310. In some embodiments, as noted above, the nickel layer(s) 330 may serve as a mechanical backing for the gold layer(s) 340.

It has been found that reliability and longevity of the multilayer ceramic assembly 300 may be improved by limiting the thickness of the gold layer(s) 340. In some instances, reliability and longevity may be improved by limiting the thickness of the gold layer(s) 340 and/or the thickness of the nickel layer(s) 330 to within particular ranges. For example, while in some cases a multilayer ceramic assembly may have a nickel layer having a thickness that is in the range of about 1.5 microns to about 9 microns, it has been found that performance is improved by using a thickness of the nickel layer(s) 330 in a range of about 5 microns to about 12 microns. In some embodiments, limiting the thickness of the nickel layer(s) to this range provides for an improved manufacturing yield during wirebonding.

While in some cases, for example, a multilayer ceramic assembly may have a gold layer having a thickness of about 1.3 microns to about 8 microns, it has been found that performance is improved by limiting the thickness of the gold layer(s) 340 to less than about 0.5 microns. In some embodiments, it has been found that a gold layer thickness that is in the range of about 0.01 microns to about 0.5 microns provides improved reliability and longevity relative to using a gold layer thickness that is greater than about 1 micron. Reducing the thickness of the gold layer(s) 340 has been found to reduce or even eliminate the formation of intermetallic compounds. In some embodiments, a gold layer 340 thickness that is less than 0.5 microns, in combination with an underlying nickel layer 330 thickness that is in, the range of about 5 microns to about 12 microns provides improved manufacturing yields.

In various implementations, the electronic assemblies described herein (e.g., MCMs with gold plating layer(s) having a thickness of less than about 0.5 microns) can maintain full electrical and/or mechanical functionality after 2000 hours of repeated thermal cycles between $-40°$ C. to $+215°$ C.

Various modifications, additions and combinations can be made to the exemplary embodiments and their various features discussed without departing from the scope of the disclosure. For example, while the embodiments described above refer to particular features, the scope of this disclosure also includes embodiments having different combinations of features and embodiments that do not include all of the above described features.

We claim:

1. An electronic assembly comprising:
   a multilayer ceramic assembly in a downhole module including:
   a ceramic substrate;
   a nickel plating layer disposed on the ceramic substrate; and
   a gold plating layer disposed directly on the nickel plating layer, the gold plating layer having a thickness of less than about 0.5 microns;
   an electronic component disposed on the multilayer ceramic assembly; and
   a wirebond extending between the electronic component and the gold plating layer.

2. The electronic assembly of claim 1, wherein the multilayer ceramic assembly comprises a high temperature co-fired ceramic substrate or a low temperature co-fired ceramic substrate.

3. The electronic assembly of claim 1, wherein the multilayer ceramic assembly comprises an aluminum oxide ceramic substrate.

4. The electronic assembly of claim 1, wherein the wirebond comprises an aluminum wirebond.

5. The electronic assembly of claim 1, wherein the nickel plating layer has a thickness that is in the range of about 5 microns to about 12 microns.

6. The electronic assembly of claim 1, wherein the gold plating layer has a thickness that is in the range of about 0.01 microns to about 0.5 microns.

7. An electronic assembly, the electronic assembly comprising:
   a multilayer ceramic assembly in a downhole module including:
   a ceramic substrate having a first surface and a second surface;
   a first nickel plating layer disposed on the first surface of the ceramic substrate;
   a second nickel plating layer disposed on the second surface of the ceramic substrate;
   a first gold plating layer directly disposed on the first nickel plating layer, the first gold plating layer having a thickness of less than about 0.5 microns; and
   a second gold plating layer directly disposed on the second nickel plating layer, the second gold plating layer having a thickness of less than about 0.5 microns;
   an electronic component disposed on the multilayer ceramic assembly; and
   a wirebond extending between the electronic component and either the first gold plating layer or the second gold plating layer.

8. The electronic assembly of claim 7, wherein the multilayer ceramic assembly comprises one of a high temperature co-fired ceramic substrate, a low temperature co-fired ceramic substrate or an aluminum oxide ceramic substrate.

9. The electronic assembly of claim 7, wherein the first nickel plating layer has a thickness that is in the range of about 5 microns to about 12 microns.

10. The electronic assembly of claim 7, wherein the second nickel plating layer has a thickness that is in the range of about 5 microns to about 12 microns.

11. The electronic assembly of claim 7, wherein the first gold plating layer has a thickness that is in the range of about 0.01 microns to about 0.5 microns.

12. The electronic assembly of claim 7, wherein the second gold plating layer has a thickness that is in the range of about 0.01 microns to about 0.5 microns.

13. A method of manufacturing an electronic assembly, the method comprising:
   providing a multilayer ceramic assembly in a downhole module having a ceramic substrate, a nickel plating layer disposed on the ceramic substrate and a gold plating layer disposed directly on the nickel plating layer, the gold plating layer having a thickness of less than about 0.5 microns;
   disposing an electronic component on the multilayer ceramic assembly; and
   extending a wirebond between the electronic component and the gold plating layer.

14. The method of claim 13, wherein providing the multilayer ceramic assembly comprises providing a multilayer ceramic assembly having a ceramic substrate, a nickel plating layer having a thickness of about 5 microns to about 12 microns, and a gold plating layer having a thickness of about 0.01 microns to about 0.5 microns.

15. The method of claim 13, wherein extending a wirebond between the electronic component and the gold plating layer comprises extending an aluminum wirebond between the electronic component and the gold plating layer.

* * * * *